United States Patent [19]
Shotton

[11] 3,935,081
[45] Jan. 27, 1976

[54] DENSITY CONTROL FOR ELECTROPLATABLE POLYMER COMPOSITIONS

[75] Inventor: James A. Shotton, Bartlesville, Okla.

[73] Assignee: Phillips Petroleum Company, Bartlesville, Okla.

[22] Filed: Aug. 14, 1973

[21] Appl. No.: 388,158

[52] U.S. Cl. .................................................. 204/30
[51] Int. Cl.$^2$.... C25D 5/56; C25D 3/38; C25D 5/10
[58] Field of Search .............................. 204/30, 213

[56] References Cited
UNITED STATES PATENTS

| | | | |
|---|---|---|---|
| 2,554,461 | 5/1951 | Howes et al. ............... | 260/42.46 X |
| 2,561,063 | 7/1951 | McBurney et al. ........... | 260/42.46 X |
| 3,466,232 | 9/1969 | Francis et al. ............... | 204/30 |
| 3,471,313 | 10/1969 | Saubestre et al. ............ | 117/47 |
| 3,556,955 | 1/1971 | Ancker et al. ............... | 204/30 |
| 3,567,532 | 3/1971 | Jezl et al. .................... | 156/2 |
| 3,728,232 | 4/1973 | Morita et al. ................ | 204/30 |
| 3,793,159 | 2/1974 | Wells ........................... | 204/30 |

OTHER PUBLICATIONS

Plating, On Plastics, 2nd Ed. by Muller et al. pp. 133–135, publ. by Robert Draper, Ltd., Teddington, 1971.

*Primary Examiner*—F. C. Edmundson

[57] ABSTRACT

A plastic composition especially suitable for use in barrel electroplating processes is prepared by incorporating in the plastic a siliceous filler and a heavy filler such as barium sulfate or zinc oxide in amounts such that the density of the molded composition is greater than the density of the plating bath.

8 Claims, No Drawings

DENSITY CONTROL FOR ELECTROPLATABLE POLYMER COMPOSITIONS

This invention relates to the electroplating of plastics. In one aspect, this invention relates to an improved electroplating process.

Small parts, such as buttons, knobs, and the like, are normally electroplated by a barrel electroplating process. When properly employed, barrel electroplating is most desirable because it eliminates racking, wiring, jigging, and the relatively expensive labor for such operations. The process involves considerably less labor than still plating and productivity is high. However, parts molded from low-density polymeric materials are not well suited for barrel electroplating processes. Such parts tend to float in the plating barrel due to the greater densities of the plating baths, thus receiving uneven or incomplate plating on some parts. Such plating baths generally have densities ranging from about 1.1 to 1.2.

It is desirable that such small parts be molded from the relatively inexpensive low-density polymers, then electroplated using a barrel electroplating process. There has been considerable effort to develop a satisfactory process for barrel electroplating molded low-density polymeric articles.

Accordingly, it is an object of this invention to provide an improved process for electroplating plastics.

It is another object to provide an improved process for barrel electroplating plastics.

Other apsects, objects and several advantages of this invention will be apparent to those skilled in the art from the following description and appended claims.

In accordance with the present invention it has been discovered that articles molded from low-density polymeric materials can be satisfactorily electroplated in a conventional electroplating process if there is incorporated therein a dual filler system consisting of a siliceous filler and a heavy filler as hereinafter defined, in an amount such that the resultant polymeric composition has a density of not less than the density of the electroplating baths. The resulting electroplated articles exhibit extremely good adhesion between the metal plate and the polymeric material. The present invention is especially applicable to a barrel electroplating process.

According to this invention, there is provided a process for electroplating low-density polymeric materials which comprises the steps of:

1. incorporating a dual filler system in the plastic;
2. molding the resulting composition into the desired configuration;
3. conditioning the resulting molded plastic article;
4. preplating the conditioned article with an electrolessly platable metal; and
5. electroplating the preplated article with a final finish to obtain a metal-plated plastic product.

The process of this invention can be utilized with any moldable plastic material. As used herein and in the claims, the term "plastic" is intended to include any natural or synthetic polymeric material which can be molded into a desired final shape using heat and/or pressure. Examples of such materials are: ABS resins, ionomers, nylons, polyarylene oxides, polyolefins, styrene polymers and copolymers such as styrene/butadiene, vinyl polymers and copolymers such as poly(vinyl chloride), poly(vinyl fluoride), vinylidene chloride/vinyl chloride copolymer, and the like, including blends.

The process of this invention is particularly applicable to any plastic having a low density, i.e., on the order of 0.8 to 1.0 g/cc, and which is inert to most chemicals.

The terms "mold", "molded", "moldable", "molding" and the like as used herein and in the claims is intended to include any plastic forming process such as film formation by extrusion, casting, or calendering, blow molding, injection molding, extrusion, vacuum forming, pressure forming, compression molding, transfer molding, thermoforming and the like.

Although the process of this invention can be utilized for electroplating of any moldable plastic as defined above, in one specific embodiment of this invention it has been found to be particularly suitable for barrel electroplating olefin polymers.

The term "olefin polymer" as used herein and in the claims is intended to include both normally solid homopolymers and copolymers of aliphatic 1-olefins having 2 to 8 carbon atoms or mixtures thereof, and terpolymers of aliphatic 1-olefins with conjugated diolefins containing from 4 to 8 carbon atoms.

Examples of the aliphatic 1-olefins and diolefins are ethylene, propylene, 1-butene, 1-pentene, 4-methylpentene-1, 1-hexane, 1-heptene, 1-octene, 1,3-butadiene, 1,4-hexadiene, 1,3-heptadiene, 1,5-octadiene, and the like. Examples of the olefin polymers and polymer blends that can be used are polyethylene, polypropylene, poly(butene-1), poly(4-methylpentene-1), ethylene/propylene copolymer, ethylene/1-butene copolymer, ethylene/1-hexene copolymer, ethylene/propylene/1,4-hexadiene terpolymer, ethylene/propylene/1-butene terpolymer, polyethylene/polypropylene blends, polyethylene/polypropylene/polydiene blends, and the like.

The dual filler system of this invention consists of a combination of siliceous filler and a heavy filler. The filled polymer should have a density at least as great as the density of the first electroplating bath. Preferably, the filled polymer has a density greater than the density of the plating baths, so that the molded article will exhibit a negative buoyancy when placed in the plating baths.

Siliceous fillers which can be utilized in the formation of the dual filler system are those having a particle size of less than 50 microns and preferably less than 10 microns. Examples of suitable siliceous fillers are the synthetic silicas and hydrated silicas, and naturally occurring minerals having a high — i.e., greater than about 70 weight percent — silica content, such as pumice, diatomaceous earth, and the like, including mixtures thereof.

The heavy fillers which can be utilized in the formation of the dual filler system of this invention are stable materials of synthetic or mineral origin which exhibit poor water solubility and which have densities of about 3.9 g/cc or higher.

Such heavy fillers generally have a particle size of less than 50 microns and preferably less than 10 microns. Such fillers include metal oxides, metal sulfates and complex metal compounds. Examples of suitable fillers are antimony trioxide, barium molybdate, barium sulfate, bismuth trioxide, cadmium oxide, calcium tungstate, chromic oxide, lead monoxide, lead sulfate, manganese dioxide, molybdenum dioxide, stannic oxide, strontium sulfate, zinc oxide, and the like and mixtures thereof.

In one presently preferred embodiment of this invention the heavy filler is zinc oxide. In another preferred embodiment the heavy filler is barium sulfate.

The fillers are utilized in amounts in the range of 15 to 60, preferably 30 to 40 weight percent based upon the total weight of filled plastic and fillers. All percentages recited hereinafter and in the claims are on this basis. By "filled" plastic is meant that portion of a plastic molding into which the filler has been incorporated. The fillers or mixtures thereof can be incorporated into the plastic by any known technique using known milling and blending equipment, such as a Banbury mixer, a Brabender Plastograph, extruders, and the like.

It is essential that at least a portion of the filler be silica, i.e., at least 10 percent and preferably 12 percent or more. The total filler content should not exceed 60 percent and preferably should not exceed 40 percent. Higher filler levels inhibit melt flow, an important consideration during molding.

Suitable ranges of polymer and siliceous and heavy fillers are shown below:

|  | Broad Range, Wt. % | Preferred Range, Wt. % |
| --- | --- | --- |
| Polymer | 40–85 | 55–70 |
| Siliceous filler | 10–40 | 12–20 |
| Heavy filler | 5–35 | 10–33 |

The weight ratio of siliceous filler to heavy filler can range from about 0.2:1 to about 5:1. In a preferred embodiment the range is from about 0.3:1 to about 1.2:1.

In addition, the filled polymer composition can also contain other ingredients normally employed to give desirable properties to the polymers. Such ingredients include antistatic agents, antioxidants, crystallization modifiers, lubricants and the like.

As indicated, it is highly desirable in the electroplating of a plastic article to be able to utilize conventional plating processes in producing a plated product having good adhesion of the metal plate thereto. Such conventional plating processes involve a preplating process which includes cleaning; conditioning or etching the surface of the plastic; sensitizing the surface of the plastic with an oxidizable salt, such as stannous chloride, that is absorbed and later reduces the activator (not all conventional processes include this step); activating the surface with a precious metal salt, such as palladium chloride; and electroless plating with either copper (about 0.005 mil to 0.010 mil) or nickel (about 0.010 to 0.030 mil). Each conditioning step is usually followed by one or more water rinses. The continuous film of electrically conductive material applied by the preplating process provides the capability for applying the final finish by conventional electrolytic processes. Following the preplate process, normal plating of copper-nickel-chrome, or nickel-chrome or any of a whole variety of final finishes, including gold and silver, can be applied by conventional electroplating techniques. For most applications the final plate will be about 0.5 to 2.0 mils thick, but even thicker plate can be applied if desired.

The molded article can be conditioned by treating with an acid chromate etch and an HF treatment.

The term "HF treatment" as used herein is intended to cover any treatment whereby the surface of the plastic article is contacted with hydrogen fluoride. For convenience, aqueous solutions of hydrofluoric acid or acid fluoride salts are employed in effecting the treatment of the surface of the plastic article with hydrogen fluoride. In addition, if desired, the HF treatment can be carried out in the vapor phase. The time required for successful treatment of the plastic article is dependent on the concentration of the HF in the treating zone. When utilizing an aqueous hydrofluoric acid solution, the concentration of the HF can be in the range of about 0.1 to saturation. When utilizing an aqueous solution containing a water-soluble acid fluoride salt, the concentration of the salt in the aqueous solution can likewise be in the range of about 0.1 weight percent to saturation, preferably 1.0 weight percent to saturation.

When carrying out a vapor phase HF treatment, the minimum temperature will be determined by that required to vaporize the HF. Thus, a temperature of at least 67° F. is used when the process is operated at atmospheric pressure, with higher temperatures being used at higher treating pressures. The maximum temperature that can be used is at least 50° F. below the softening point of the plastic being treated. The HF treatment is ordinarily carried out utilizing an aqueous solution of the treating agent for a period of 0.1 to 10 minutes, and preferably 2 to 4 minutes.

The HF treatment is normally carried out at room temperature when utilizing an aqueous treating agent but can be carried out at temperatures up to essentially the boiling point of the solution. Temperatures above the normal boiling point also can be used, provided the pressure is sufficient to maintain a liquid phase. Temperatures in the range of 30° to 200° F. are suitable for the aqueous systems.

The "acid chromate etch" treatment is that conventionally employed in metal plating and is normally carried out at temperatures in the range of 75° to 200° F. The acid chromate etch treatment is generally carried out for a period of time in the range of 0.1 to 20 minutes.

1. concentrated sulfuric acid (750 ml)
2. water (2271 ml)
3. $CrO_3$ (1360 grams)
4. surfactant (20 milligrams).

The following procedures are representative of the conventional plating processes and conditions which can be used in the electroplating of conditioned plastics in accordance with this invention.

It is to be understood that the recitation of specific plating solutions and steps in no way limits the invention to these specific solutions and steps. There are numerous plating systems available, and the process of the invention can be used with any of them, so long as the HF treatment, as herein defined, follows the acid chromate etch.

1. Immerse in a sodium pyrophosphate cleaning solution for 2 to 5 minutes at 75° to 140° F.
2. Immerse in a sodium bisulfate neutralizing solution for 15 to 30 seconds at 75° F.
3. Immerse in an acid chromate etching solution for 0.1 to 20 minutes at 75° to 200° F.
4. Immerse in an aqueous solution of ammonium bifluoride for 0.1 to 10 minutes at 30° to 200° F.
5. Rinse with 5 weight percent HCl containing about 10–20 ppm of a wetting agent.
6. Immerse in a stannous chloride sensitizing solution for 15 to 60 seconds at 75° F.
7. Immerse in a palladium-ammonium chloride activating solution for 15 to 60 seconds at 75° F.

8. Immerse in an electroless Ni plating solution for 5 to 30 minutes at 75° F. The electroless Ni solution can be prepared as follows:

|  | g/l |
|---|---|
| NiSO$_4$ . 7H$_2$O | 40 |
| Sodium citrate | 24 |
| Sodium pyrophosphite | 20 |
| Sodium acetate | 14 |
| Ammonium chloride | 5 |
| (density ca | 1.10 g/cc) |

9a. strike with nickel. The composition of the nickel strike bath and conditions for plating are as follows:

Composition of Nickel Strike Bath

| NiSO$_4$ . 6H$_2$O | 300–410 grams |
|---|---|
| NiCl$_2$.3½ H$_2$O | 30–45 grams |
| Nickel brightener | 10 ml |
| Water to make | 1 liter |
| (density ca | 1.18–1.25 g/cc) |

Plating Conditions

| Voltage | 6–18 volts D.C. |
|---|---|
| Current density | 30–80 amp/ft$^2$ |
| Current efficiency | 100 % |
| Anode | nickel (99.5%) |
| Temperature | 75–155° F. |
| Time | variable |
| Agitated bath | | or b. Strike with copper. The composition of the copper strike bath and conditions for plating are as follows:

Composition of Copper Strike Bath

| CuSO$_4$ . 5H$_2$O | 98 g |
|---|---|
| H$_2$SO$_4$ (conc.) | 15.5 ml |
| Brightener | 1 ml |
| Water to make | 1 liter |
| (density ca | 1.13 g/cc) |

Plating Conditions

| Voltage | 2 volts D.C. |
|---|---|
| Current density | 10–15 amp/ft$^2$ |
| Current efficiency | 100 % |
| Anode | electrolytic copper |
| Temperature | 75–80° F. |
| Time | variable |
| Agitated bath | |

10. After electroless plating, the resulting electrically conductive product can be electroplated with any combination of conventional plating solutions.

Following is an example of a typical copper plating solution and conditions for plating. Numerous other solutions are known and can be utilized if desired.

11. Electroplate with bright copper. The composition of the bright copper bath and conditions for plating are as follows:

Composition of Bright Copper Bath

| CuSO$_4$ . 5H$_2$O | 212 grams |
|---|---|
| H$_2$SO$_4$ (conc.) | 28.8 ml |
| Brightener | 4 ml |
| NaCl | 75 mg |
| Water to make | 1 liter |
| (density ca | 1.17 g/cc) |

Plating Conditions

| Voltage | 4 volts D.C. |
|---|---|
| Current density | 30–40 amp/ft$^2$ |
| Current efficiency | 98–100% |
| Anode | electrolytic copper |
| Temperature | 75–80° F. |
| Time | variable |
| Agitated bath | |

Ordinarily each conditioning and plating step is followed by one or more water rinses.

The following specific examples are presented further to illustrate the invention but should not be interpreted to restrict or limit the invention.

The plastic-filler blends used in the examples were prepared by blending the indicated amounts of plastic and fillers in either a Brabender Plastograph for 5 to 10 minutes at 50 to 75 rpm at about 370° F. in a nitrogen atmosphere or in a Banbury mixer for about 5 minutes at about 350° F. in an air atmosphere.

EXAMPLE I

Blends of filler and plastic were prepared by mixing a propylene/ethylene copolymer with the fillers shown below in a Banbury mixer for about 5 minutes at about 350° F. The values for polymer and fillers are in terms of weight percent.

Table I

| Sample No. | 1 | 2 | 3 |
|---|---|---|---|
| Polymer | 60.9$^a$ | 66.7$^a$ | 60.6$^b$ |
| Silica | 17.4$^c$ | 14.7$^c$ | 10.1$^d$ |
| Barytes | 21.6 | 18.7 | — |
| Zinc oxide | — | — | 29.2 |
| Density, g/cc | 1.27 | 1.21 | 1.32 |

$^a$Melt flow, ASTM D1238-70, Condition L  4
Flexural modulus, ASTM D790-70  190,000 psi
Density, ASTM D1505-68  0.904 g/cc
$^b$Melt flow  3
Flexural modulus  170,000 psi
Density  0.903 g/cc
$^c$Precipitated hydrated silica, average particle size 0.022 microns
$^d$Natural silica, average particle size about 1.5 microns This example illustrates that control of polymer density is easily achieved by the present invention.

EXAMPLE II

A series of plating tests was performed using the compositions of Example I. Plaques were molded from the blends, conditioned, coated with electroless nickel and then electroplated with copper as described above.

Adhesion values of the metal plate to the plastic were determined by pulling a ½-inch-wide strip of the metal layer for the plated specimens using an Instron tester. The metal plate was first cut; one end of the ½-inch-wide strip was pulled loose from the plastic for a distance of one-half to three-fourths inch. This plated sample was attached to the traverse of the Instron tester. The metal tab was attached to the upper jaw by means of a clamp and a 2-foot-long wire. The long wire was used so that the pulling angle would not change appreciably as the metal was separated from the plastic surface. The metal was pulled from the plastic surface at an angle of 90° and at a rate of 2 inches per minutes. The average value of the force, in pounds, required to separate the metal and plastic, multiplied by 2, gives the adhesion of the metal plate to the plastic in terms of pounds per lineal inch of contact. In these tests the bright copper plate was 2 to 2.5 mils thick so that the metal itself would not yield during the test. The adhesion values are shown in Table II.

Table II

| Run No. | Sample No. Used | Chromate Etch Time (min.) | Chromate Etch Temp.,°F. | Bifluoride Etch Time (min.) | Bifluoride Etch Temp., °F. | Adhesion, Lbs/Inch |
|---|---|---|---|---|---|---|
| 1 | 1 | 6 | 145 | 2 | 80 | 15 |
| 2 | 1 | 10 | " | " | " | 20 |
| 3 | 2 | 6 | 140 | " | " | 10 |
| 4 | 2 | 8 | " | " | " | 11 |
| 5 | 2 | 10 | " | " | " | 14 |
| 6 | 2 | 12 | " | " | " | 14 |
| 7 | 3 | 4 | " | " | " | 7 |
| 8 | 3 | 6 | " | " | " | 6 |
| 9 | 3 | 8 | " | " | " | 13 |
| 10 | 3 | 10 | " | " | " | 13 |

The results show that good adhesion was obtained using the dual filler system of this invention.

Reasonable variations and modifications of this invention can be made or followed, in view of the foregoing disclosure, without departing from the spirit or scope thereof.

I claim:

1. A process for barrel electroplating a normally solid polymer which comprises the steps of:
   a. incorporating a filler system into said plastic, said filler system consisting of a siliceous filler and a heavy filler selected from the group consisting of barium sulfate and zinc oxide;
   b. molding the resulting composition of plastic and fillers;
   c. conditioning the molded plastic product of step (b) by contacting same with a combination, in series, of (1) an acid chromate etch and (2) an HF treatment;
   d. preplating the resulting conditioned product of step (c) with an electrolessly platable metal; and
   e. electroplating the preplated product of step (d) with a final finish to obtain a metal-plated plastic product; wherein said siliceous filler is present in an amount ranging from 10 to 40 weight percent, said heavy filler is present in an amount ranging from 5 to 35 weight percent, and the filler system of said siliceous and said heavy filler is present in an amount ranging from 15 to 60 weight percent, and the weight ratio of said siliceous filler to said heavy filler is in the range of about 0.2:1 to about 5:1, and wherein the composition resulting from step (a) has a density not less than the density of the plating baths of steps (d) and (e).

2. The process of claim 1 wherein said filler system is present in an amount ranging from 30 to 45 weight percent.

3. The process of claim 2 wherein said polymer is a normally solid polyolefin.

4. The process of claim 3 wherein said polyolefin is polyethylene.

5. The process of claim 3 wherein said polyolefin is polypropylene.

6. The process of claim 3 wherein said polyolefin is a copolymer of ethylene and propylene.

7. The process of claim 6 wherein said filler system consists of silica and barium sulfate.

8. The process of claim 6 wherein said filler system consists of silica and zinc oxide.

* * * * *